United States Patent
Akutagawa et al.

(10) Patent No.: US 7,466,405 B2
(45) Date of Patent: Dec. 16, 2008

(54) PATTERN INSPECTION METHOD, PATTERN INSPECTION SYSTEM AND PATTERN INSPECTION PROGRAM OF PHOTOMASK

(75) Inventors: Satoshi Akutagawa, Akiruno (JP); Kazuhiko Takahashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/093,264

(22) Filed: Mar. 30, 2005

(65) Prior Publication Data
US 2005/0220332 A1 Oct. 6, 2005

Related U.S. Application Data

(63) Continuation of application No. PCT/JP03/04072, filed on Mar. 31, 2003.

(51) Int. Cl.
*G01N 21/00* (2006.01)
(52) U.S. Cl. .................................................. 356/237.4
(58) Field of Classification Search .... 356/237.1–237.6
See application file for complete search history.

(56) References Cited

U.S. PATENT DOCUMENTS

| | | | |
|---|---|---|---|
| 3,787,117 A | | 1/1974 | Watkins |
| 4,360,269 A | * | 11/1982 | Iwamoto et al. ............. 356/426 |
| 4,641,353 A | * | 2/1987 | Kobayashi ................... 382/144 |
| 4,926,489 A | * | 5/1990 | Danielson et al. ........... 382/144 |
| 5,471,066 A | * | 11/1995 | Hagiwara ................. 250/559.48 |
| 6,297,879 B1 | * | 10/2001 | Yang et al. ................ 356/237.5 |
| 7,065,240 B2 | * | 6/2006 | Tada .......................... 382/145 |

FOREIGN PATENT DOCUMENTS

| | | |
|---|---|---|
| JP | 9-297109 | 11/1997 |
| JP | 10-293393 | 11/1998 |
| JP | 2000-147748 | 5/2000 |
| JP | 2002-243426 | 8/2002 |

* cited by examiner

*Primary Examiner*—Tarifur R. Chowdhury
*Assistant Examiner*—Isiaka O Akanbi
(74) *Attorney, Agent, or Firm*—Staas & Halsey LLP (57) ABSTRACT

An image of an inspection object pattern formed on a photomask is acquired, which is to be transformed into inspection object pattern data as input data of light intensity distribution simulation for finding light intensity distribution in which optical conditions of an exposure system used in pattern transfer are reflected. The light intensity distribution simulation is performed using the inspection object pattern data, and a difference between light intensity distribution of the inspection object pattern obtained by the light intensity distribution simulation and reference light intensity distribution is found. Inverse light intensity distribution simulation having reversibility to the light intensity distribution simulation is performed using the difference, to obtain difference pattern data determining a defect in the inspection object pattern. Consequently, the presence/absence of the defect in the inspection object pattern can be determined highly accurately and defect location in the inspection object pattern can be identified easily and certainly.

20 Claims, 7 Drawing Sheets

Fig. 1

(a) reticle pattern image

(b) reticle pattern data

(c) light intensity distribution

Fig. 2

(a) drawing pattern data (b) light intensity distribution

Fig. 3 light intensity distribution (Fig. 2(c))

light intensity distribution (Fig. 3(b))

(a) difference (b) difference pattern data

PATTERN INSPECTION METHOD, PATTERN INSPECTION SYSTEM AND PATTERN INSPECTION PROGRAM OF PHOTOMASK

CROSS-REFERENCE TO RELATED APPLICATIONS

This application is a continuation application of PCT International Patent Application No. PCT/JP03/04072, filed on Mar. 31, 2003, the entire contents of which are incorporated herein by reference.

BACKGROUND OF THE INVENTION

1. Field of the Invention

The present invention relates to pattern inspection of a photomask used in the process of manufacturing semiconductor devices, display devices such as a PDP (Plasma Display Panel) and LCD (Liquid Crystal Display), and magnetic devices such as a magnetic head of a hard disk.

2. Description of the Related Art

As element structure of a semiconductor device becomes finer, Optical Proximity Effects (OPE) by which a mask pattern formed on a photomask (reticle) used in manufacturing process is not transferred onto a wafer as designed data have been actualized in recent years. Therefore, the technology called Optical Proximity Corrects (OPC) is applied in forming the mask pattern. According to the Optical Proximity Corrects, a correction pattern with the influence of the Optical Proximity Effects taken into account is added to the mask pattern in advance, to thereby make the pattern formed on the wafer the same as the design data.

As conventional inspection methods of the mask pattern, an inspection method of detecting a mismatched part by comparing the mask patterns with each other (die-to-die comparison method), and an inspection method of detecting a mismatched part by comparing the mask pattern with the design data (die-to-database comparison method) are used. The quality of the mask pattern is decided whether or not desired device characteristics are realized by the pattern formed on the wafer by the pattern transfer. Therefore, a defect is determined by comparing the measure of the mismatched part with allowable measure for every pattern shape and area. Incidentally, the allowable measure is set so that the desired device characteristics are realized by the pattern formed on the wafer by the pattern transfer. Namely, when the desired device characteristics are realized by the pattern formed on the wafer by the pattern transfer, the detected mismatched part is determined to be a false defect, not the defect.

However, a pattern of a fine dimension which is determined to be the false defect by the conventional inspection method of the mask pattern has come to be corrected according to the Optical Proximity Corrects. Therefore, it is impossible to accurately determine the defect in the fined pattern according to the conventional inspection method of the mask pattern.

A pattern inspection method of the reticle to solve the above problem is disclosed in, for example, Japanese Patent Application Publication No. Hei 9-297109 and so on. According to this pattern inspection method, light intensity distribution of a reticle pattern to be an inspection object and light intensity distribution of a design pattern are found by simulation. It should be noted that the light intensity distribution obtained by the simulation corresponds to light intensity distribution which is actually obtained through a reduction optical system of a stepper. Then, the reticle pattern is inspected by comparing the light intensity distribution with one another.

According to this pattern inspection method, the patterns (light intensity distribution) which are formed on the wafer by the pattern transfer using the reticle pattern and the design pattern are compared with each other, and therefore it is possible to determine with high accuracy the presence/absence of the defect that matters with respect to the characteristics of the device formed on the wafer. However, since the reticle pattern and the pattern formed on the wafer does not agree with each other, defect location in the reticle pattern cannot be identified even though defect location in the pattern formed on the wafer can be identified by comparing the light intensity distribution. Therefore, in order to correct the defect in the reticle pattern accurately, defect correction and inspection of the reticle pattern need to be repeated depending on experiences and intuitions of an operator. Namely, it is impossible to correct the defect in the reticle pattern with ease. As a result of this, production cost of the reticle increases. In other words, manufacturing cost of a semiconductor device increases. Therefore, an inspection method which can determine the presence/absence of the defect in the reticle pattern with high accuracy and identify the defect location in the reticle pattern is required.

An appearance inspection method of a printed circuit board on which components are mounted is disclosed in, for example, Japanese Patent Application Publication No. 2002-243426 and so on. According to this appearance inspection method, the image of an inspection object and the image of a reference object are first subjected to a Fourier transform, respectively, to obtain optical diffraction patterns. Next, the obtained optical diffraction patterns are superposed on each other, to optically find a difference or perform Exclusive OR. Then, the result of the difference or Exclusive OR is subjected to an inverse Fourier transform, to obtain the image of a defect part in the inspection object. Thus, component absence, component fitting abnormality and the like of the printed circuit board can be detected.

According to this appearance inspection method, whether or not the shape of the inspection object agrees with the shape of the reference object is inspected. Namely, whether or not the component in question is mounted on the printed circuit board as expected is inspected. On the contrary, according to the pattern inspection of the photomask, whether or not the desired device characteristics are realized by the pattern formed on the wafer by the pattern transfer needs to be inspected.

SUMMARY OF THE INVENTION

It is an object of the present invention to determine the presence/absence of a defect in a pattern formed on a photomask with high accuracy and identify defect location in the pattern easily and certainly.

It is another object of the present invention to improve the efficiency of inspection of the pattern formed on the photomask.

It is still another object of the present invention to easily correct the defect in the pattern formed on the photomask.

It is yet another object of the present invention to reduce production cost of the photomask.

It is still another object of the present invention to reduce manufacturing cost of a device manufactured using the photomask.

According to a mode of the present invention, an image of an inspection object pattern formed on the photomask is first acquired. Next, the image of the inspection object pattern is transformed into inspection object pattern data. The inspection object pattern data is input data of light intensity distribution simulation for finding light intensity distribution in which optical conditions of an exposure system used in pattern transfer are reflected. Then, the light intensity distribution simulation is performed using the inspection object pattern data. Next, a difference between light intensity distribution of the inspection object pattern obtained by the light intensity distribution simulation and reference light intensity distribution is found. Then, inverse light intensity distribution simulation having reversibility to the light intensity distribution simulation is performed by using the difference, to obtain difference pattern data for determining a defect in the inspection object pattern.

A pattern inspection system of the photomask to which the present invention is applied includes an image acquisition unit which acquires the image of the inspection object pattern and a control unit which inspects the inspection object pattern. The control unit performs the above-described processing. Further, a pattern inspection program of the photomask to which the present invention is applied includes the above-described processing and is executed by a computer inspecting the inspection object pattern.

The inverse light intensity distribution simulation is performed using the difference between the light intensity distribution of the inspection object pattern and the reference light intensity distribution, so that a differential between the pattern formed by transferring the inspection object pattern and the pattern corresponding to the reference light intensity distribution can be recognized as the defect in the inspection object pattern. Further, since the difference pattern data corresponds to the image of the differential between the pattern formed by transferring the inspection object pattern and the pattern corresponding to the reference light intensity distribution, the defect in the inspection object pattern can be recognized as the image. Therefore, the presence/absence of the defect in the inspection object pattern can be determined with high accuracy, and defect location in the inspection object pattern can be identified easily and certainly. Therefore, pattern inspection time of the photomask can be shortened. As a result of this, production cost of the photomask can be reduced. In other words, manufacturing cost of a device manufactured using the photomask can be reduced.

According to another mode of the present invention, the reference light intensity distribution is light intensity distribution obtained by performing the light intensity distribution simulation using drawing pattern data used in pattern formation of the photomask.

The drawing pattern data is already generated for the pattern formation of the photomask. Therefore, it is not necessary to newly generate the input data of the light intensity distribution simulation for obtaining the reference light intensity distribution.

The drawing pattern data is generated so that the pattern formed on a transfer target by transferring the inspection object pattern realizes desired device characteristics. Therefore, when the inspection object pattern is formed the same as the drawing pattern data, the device formed on the transfer target has the desired characteristics. As a result of this, the light intensity distribution obtained by the light intensity distribution simulation using the drawing pattern data is suitable for an object to be compared with the light intensity distribution of the inspection object pattern. Therefore, the presence/absence of the defect in the inspection object pattern can be determined with high accuracy, and the defect location in the inspection object pattern can be identified certainly.

Moreover, by keeping the light intensity distribution obtained by the light intensity distribution simulation using the drawing pattern data, it becomes unnecessary to perform the light intensity distribution simulation using the drawing pattern data when performing the pattern inspection again. Therefore, it is possible to improve the efficiency of the pattern inspection of the photomask.

According to another mode of the present invention, the reference light intensity distribution is light intensity distribution of a pattern to be formed on a transfer target by transferring the inspection object pattern.

When the pattern to be formed on the transfer target is actually formed on the transfer target, the device formed on the transfer target has the desired characteristics. Therefore, the light intensity distribution of the pattern to be formed on the transfer target is the ideal light intensity distribution as the object to be compared with the light intensity distribution of the inspection object pattern. As a result of this, the presence/absence of the defect in the inspection object pattern can be determined with high accuracy, and the defect location in the inspection object pattern can be identified certainly.

Moreover, by preparing the light intensity distribution of the pattern to be formed on the transfer target in advance, it becomes unnecessary to perform the light intensity distribution simulation for obtaining the reference light intensity distribution. Therefore, it is possible to improve the efficiency of the pattern inspection of the photomask.

According to another mode of the present invention, the light intensity distribution simulation is performed using a Fourier transform (FFT: Fast Fourier Transform). The inverse light intensity distribution simulation is performed using an inverse Fourier transform (IFFT: Inverse Fast Fourier Transform).

According to the Fourier transform and the inverse Fourier transform, one transforms the output of the other to thereby restore the input of the other. Therefore, by using the Fourier transform and the inverse Fourier transform for the light intensity distribution simulation and the inverse light intensity distribution simulation, respectively, the presence/absence of the defect in the inspection object pattern can be determined with high accuracy, and the defect location in the inspection object pattern can be identified easily and certainly.

According to another aspect of the present invention, a differential pattern constituted of a mismatched part between the inspection object pattern and a reference pattern is detected first by comparing the image of the inspection object pattern and an image of the reference pattern, before the image of the inspection object pattern is transformed into the inspection object pattern data. Then, the measure of the differential pattern is compared with reference measure, and processing of the transformation from the image of the inspection object pattern into the inspection object pattern data and afterward are performed only when the measure of the differential pattern exceeds the reference measure.

Since the differential pattern is detected only by directly comparing the image of the inspection object pattern with the image of the reference pattern, defect determination of the inspection object pattern using the differential pattern can be performed in a short period of time. The processing of the transformation from the image of the inspection object pattern into the inspection object pattern data and afterward are performed only when the measure of the differential pattern exceeds the reference measure, so that wasteful processes of the pattern inspection of the photomask can be eliminated. Namely, the defect determination with low accuracy is first performed in the short period of time, and the defect determination with high accuracy is performed only when the inspection object pattern is determined to have the defect, so that the efficiency of the pattern inspection of the photomask can be improved.

According to another mode of the present invention, a defect in the inspection object pattern is determined using the difference pattern data.

By using the difference pattern data corresponding to the image of the differential between the pattern formed by transferring the inspection object pattern and the pattern corresponding to the reference light intensity distribution, it is possible to determine the defect in the inspection object pattern without depending on an operator.

According to another mode of the present invention, a pattern inspection system of the photomask to which the present invention is applied comprises a correction unit for correcting the defect in the inspection object pattern based on the result of determination of the defect in the inspection object pattern.

By providing the correction unit, it is possible to automatically correct the defect in the inspection object pattern. Since no intervention of manpower is necessary, it is possible to correct the defect in the inspection object pattern in a short period of time.

According to another mode of the present invention, light intensity distribution simulation for finding light intensity distribution in which optical conditions of an exposure system used in pattern transfer are reflected is first performed, using drawing pattern data used in pattern formation of the photomask. Next, a difference between the light intensity distribution obtained by the light intensity distribution simulation and light intensity distribution of a pattern to be formed on a transfer target by transferring an inspection object pattern formed on the photomask is found. Then, inverse light intensity distribution simulation having reversibility to the light intensity distribution simulation is performed by using the difference, to obtain difference pattern data for determining a defect in the inspection object pattern.

A pattern inspection system of the photomask to which the present invention is applied includes a control unit which inspects the inspection object pattern. The control unit performs the above-described processing. Further, a pattern inspection program of the photomask to which the present invention is applied includes the above-described processing and is executed by a computer inspecting the inspection object pattern.

The inverse light intensity distribution simulation is performed using the difference between the light intensity distribution obtained by the light intensity distribution simulation using the drawing pattern data and the light intensity distribution of the pattern to be formed on the transfer target, so that a differential between the pattern formed by transferring the pattern shown by the drawing pattern data and the pattern to be formed on the transfer target can be recognized as the defect in the pattern shown by the drawing pattern data.

Further, since the difference pattern data corresponds to the image of the differential between the pattern formed by transferring the pattern shown by the drawing pattern data and the pattern to be formed on the transfer target, the defect in the pattern shown by the drawing pattern data can be recognized as the image. The defect in the pattern shown by the drawing pattern data can be treated as the defect in the inspection object pattern, especially when the inspection object pattern is formed almost the same as the drawing pattern data.

When the pattern to be formed on the transfer target is actually formed on the transfer target, the device formed on the transfer target has the desired characteristics. Therefore, the light intensity distribution of the pattern to be formed on the transfer target is the ideal light intensity distribution as the object to be compared with the light intensity distribution obtained by the light intensity distribution simulation using the drawing pattern data. Therefore, the presence/absence of the defect in the inspection object pattern can be determined with high accuracy, and the defect location in the inspection object pattern can be identified easily and certainly. Therefore, the pattern inspection time of the photomask can be shortened. As a result of this, the production cost of the photomask can be reduced. In other words, the manufacturing cost of the device manufactured using the photomask can be reduced.

By treating the defect in the pattern shown by the drawing pattern data as the defect in the inspection object pattern, it becomes unnecessary to acquire the image of the inspection object pattern. The drawing pattern data is already generated for the pattern formation of the photomask. Moreover, by preparing the light intensity distribution of the pattern to be formed on the transfer target in advance, it becomes unnecessary to perform the light intensity distribution simulation for obtaining the light intensity distribution to be compared with the light intensity distribution obtained by the light intensity distribution simulation using the drawing pattern data. Therefore, it is possible to improve the efficiency of the pattern inspection of the photomask.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Hereinafter, preferred embodiments of the present invention will be explained with reference to the drawings.

Figure 1:
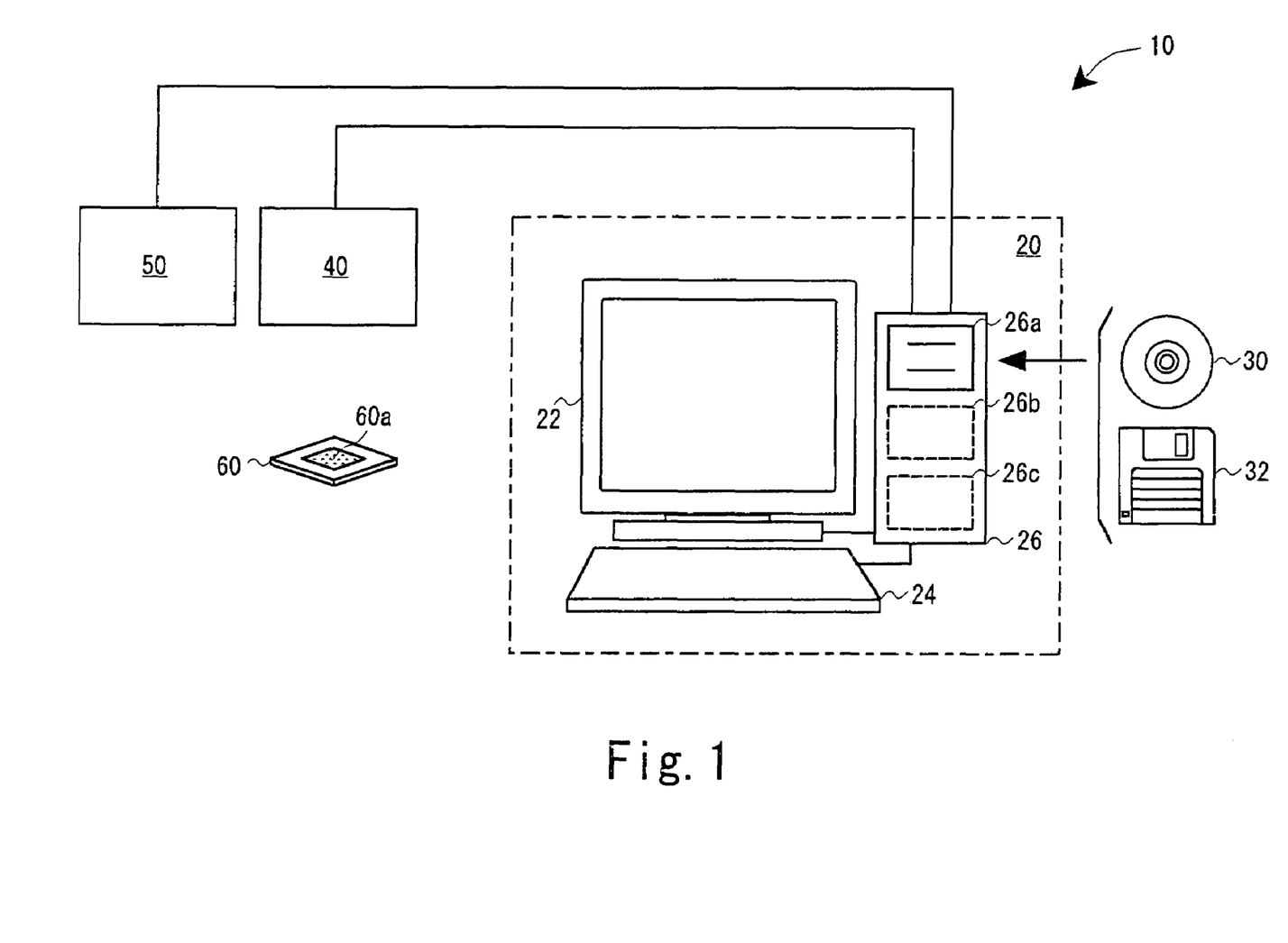
FIG. 1 is a block diagram showing a first embodiment of the present invention.

FIG. 1 shows a first embodiment of the present invention.

A pattern inspection system 10 is constituted of a workstation 20 (control unit), a CD-ROM 30 or a flexible disk 32 in which a pattern inspection program is recorded, a scanning electron microscope 40 (hereinafter also referred to as the SEM), and a focused ion beam machining apparatus 50 (hereinafter also referred to as the FIB machining apparatus).

The workstation 20 includes a display 22 to display a screen, a keyboard 24 to provide instructions by pressing keys, and a control device 26 in which a recording medium drive device 26a, a CPU 26b and a hard disk 26c are contained. The CD-ROM 30 and the flexible disk 32 can be inserted in the recording medium drive device 26a. After the CD-ROM 30 or the flexible disk 32 is inserted in the recording medium drive device 26*a*, the workstation 20 follows the instruction inputted via the keyboard 24 to download the pattern inspection program which is recorded in the CD-ROM 30 or the flexible disk 32 to the hard disk 26*c*.

The SEM 40 responds to a request from the workstation 20 to function as an image acquisition unit which acquires the image of a reticle pattern 60*a* (inspection object pattern) formed on a reticle 60 (photomask). The image of the reticle pattern 60*a* acquired by the SEM 40 is stored in the hard disk 26*c*, which can be displayed on the display 22, for example.

The FIB machining apparatus 50 follows an instruction from the workstation 20 to function as a correction unit which corrects a defect in the reticle pattern 60*a*. Incidentally, the SEM 40 and the FIB machining apparatus 50 may be constituted as one apparatus.

With the constitution described above, the CPU 26*b* executes the pattern inspection program which is stored in the hard disk 26*c*, so that pattern inspection of the reticle 60 is made possible. Moreover, defect correction of the reticle pattern 60*a* based on the result of pattern inspection of the reticle 60 is also made possible.

Figure 2:
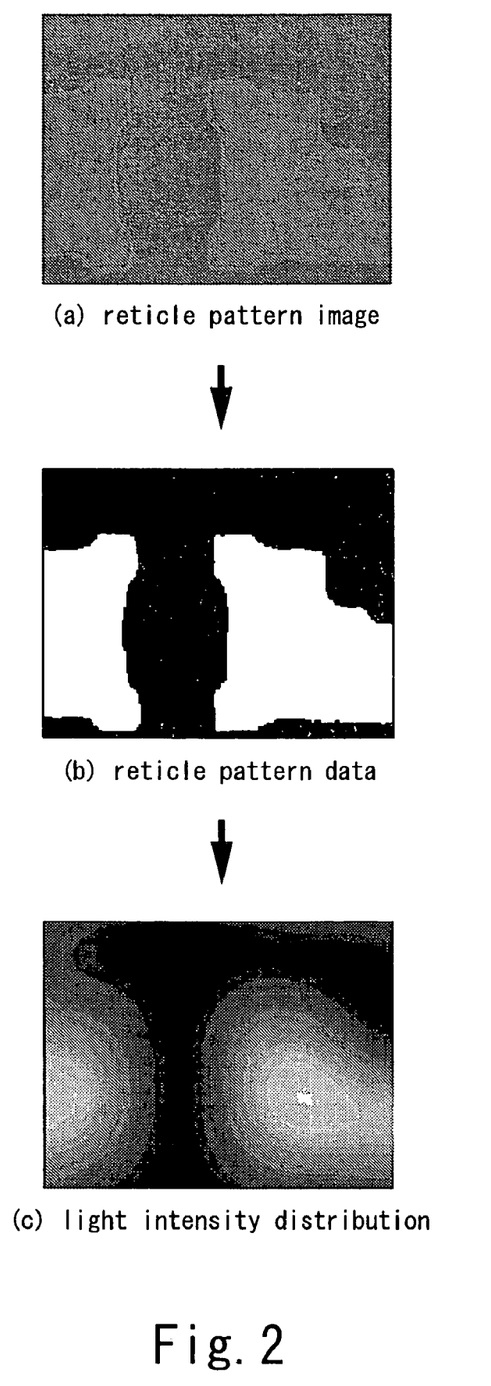
FIG. 2 are explanatory views showing processing concerning a reticle pattern according to the first embodiment.
Figure 3:
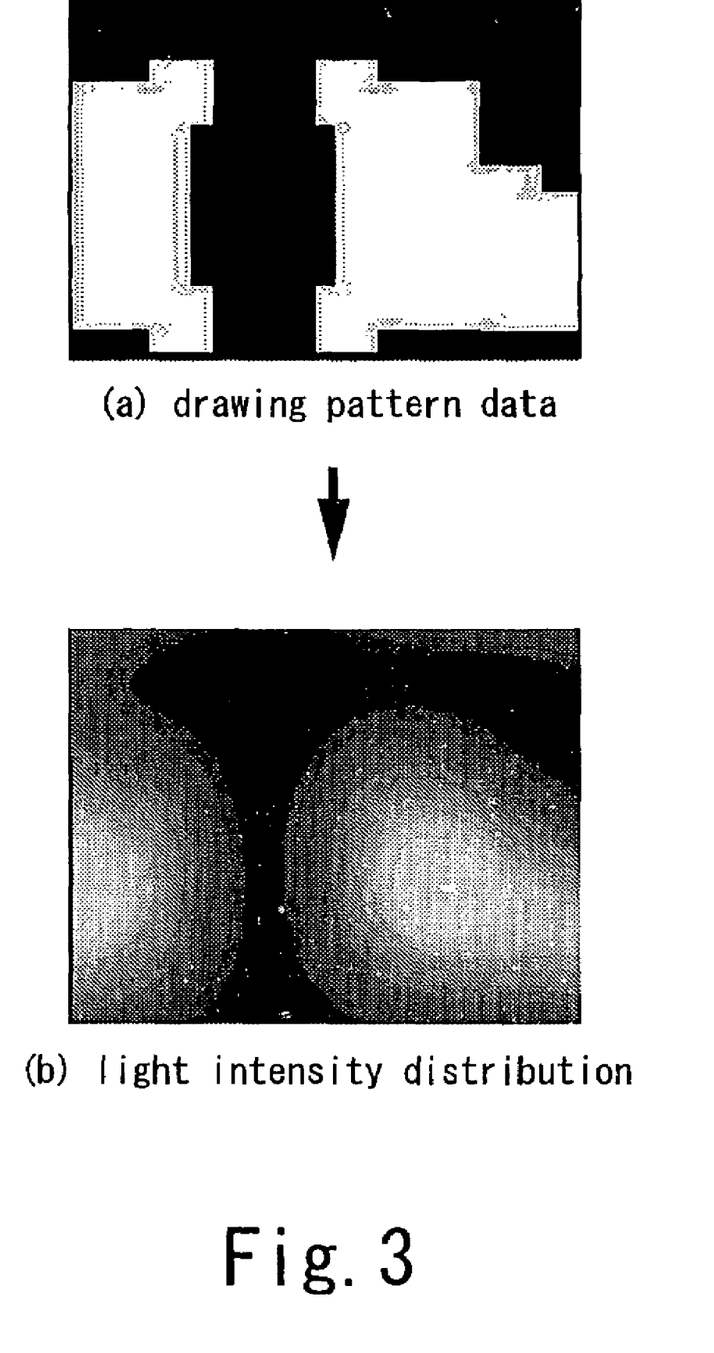
FIG. 3 are explanatory views showing processing concerning a drawing pattern according to the first embodiment.
Figure 4:
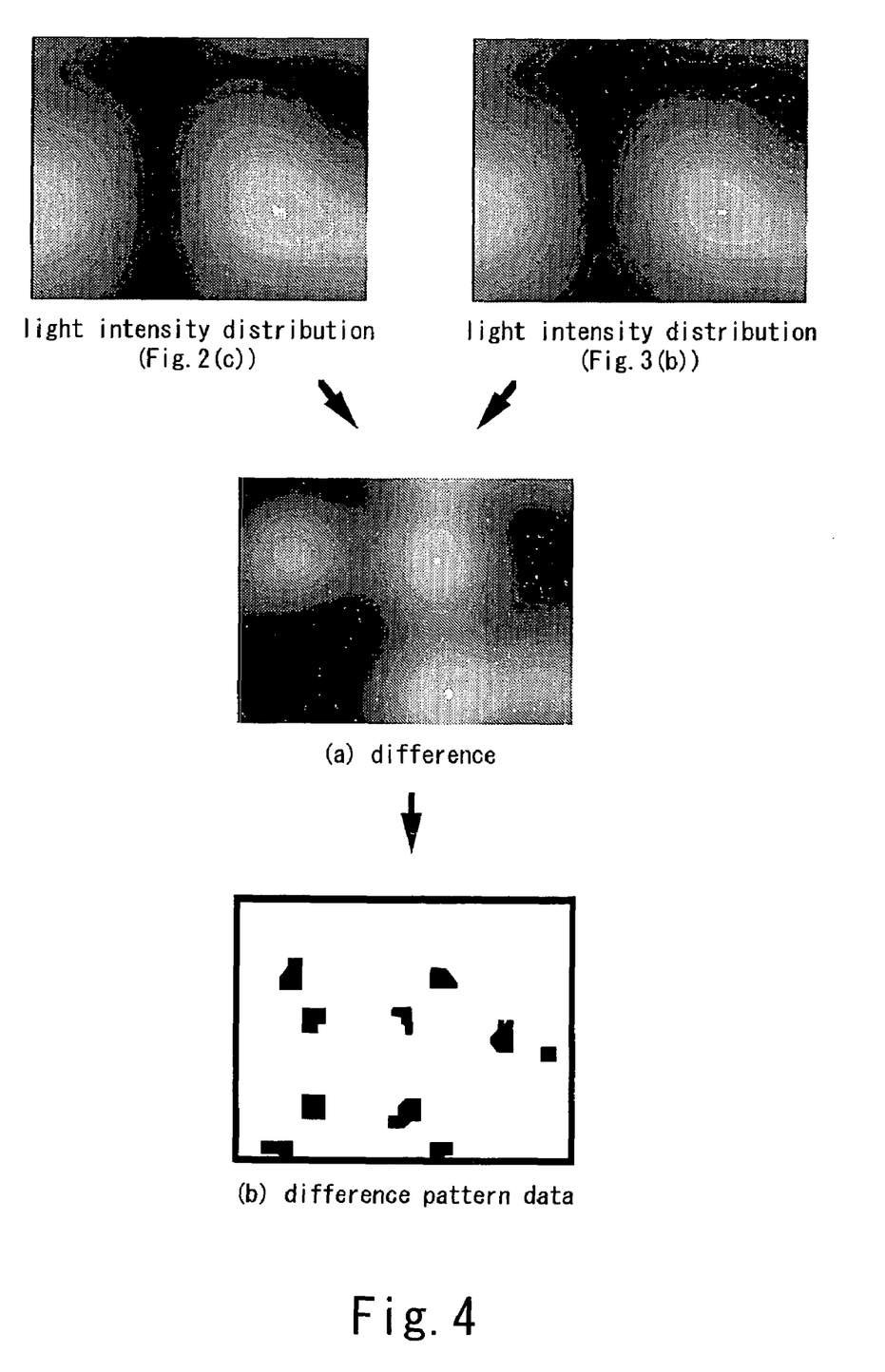
FIG. 4 are explanatory views showing processing concerning a difference according to the first embodiment.

FIG. 2 to FIG. 4 show the outline of pattern inspection processing according to the first embodiment.

First, the SEM 40 responds to the request from the workstation 20 to acquire the image of the reticle pattern 60*a* (FIG. 2(*a*)). Namely, the image of the reticle pattern 60*a* is stored in the hard disk 26*c*.

Next, the workstation 20 transforms the image of the reticle pattern 60*a* which is stored in the hard disk 26*c* into reticle pattern data (inspection object pattern data) (FIG. 2(*b*)). The reticle pattern data is input data of light intensity distribution simulation. In the light intensity distribution simulation, light intensity distribution in which optical conditions of a stepper (exposure system) used in pattern transfer are reflected is found.

Then, the workstation 20 performs the light intensity distribution simulation using the reticle pattern data, to thereby obtain the light intensity distribution of the reticle pattern 60*a* (FIG. 2(*c*)). The light intensity distribution simulation is performed using a Fourier transform.

Further, the workstation 20 performs the light intensity distribution simulation using drawing pattern data (FIG. 3(*a*)) which is used in pattern formation of the reticle 60 in advance, to thereby obtain the light intensity distribution (FIG. 3(*b*)). The obtained light intensity distribution (reference light intensity distribution) is stored in the hard disk 26*c*. The drawing pattern data is, for example, design data in GDSII format. Moreover, in the workstation 20, the light intensity distribution (reference light intensity distribution) of a pattern to be formed on a wafer by transferring the reticle pattern 60*a* to the wafer is also stored in the hard disk 26*c* in advance. A selection between the two is made by an operator operating the workstation 20 in advance, to be used in the pattern inspection of the reticle 60. Hereinafter, the case where the light intensity distribution which is obtained by the light intensity distribution simulation using the drawing pattern data is selected will be explained. Incidentally, the pattern inspection processing of the reticle 60 is the same in the case where the light intensity distribution of the pattern to be formed on the wafer is selected, and hence explanations thereof will be omitted.

First, the workstation 20 finds a difference between the light intensity distribution of the reticle pattern 60*a* and the light intensity distribution which is obtained by the light intensity distribution simulation using the drawing pattern data (FIG. 4(*a*)).

Then, the workstation 20*a* performs inverse light intensity distribution simulation using the difference, to thereby obtain difference pattern data for determining the defect in the reticle pattern 60*a* (FIG. 4(*b*)). The inverse light intensity distribution simulation has reversibility to the light intensity distribution simulation, and is performed using an inverse Fourier transform. Namely, by the inverse light intensity distribution simulation, the data corresponding to the image is restored from the light intensity distribution. Therefore, when the inverse light intensity distribution simulation is performed using the difference, the difference pattern data corresponding to the image including only the defect part in the reticle pattern 60*a* can be obtained.

Next, the workstation 20 automatically determines the defect in the reticle pattern 60*a* using the difference pattern data. For example, the image shown by the difference pattern data and the image of the reticle pattern 60*a* are displayed on the display 22 in an overlapping manner. When the reticle pattern 60*a* does not have the defect, the pattern inspection of the reticle 60 is completed. When the reticle pattern 60*a* has the defect, data showing the shape, location and the like of the defect in the reticle pattern 60*a* is generated from the difference pattern data.

Then, the workstation 20 transfers the data showing the shape, location and the like of the defect in the reticle pattern 60*a* to the FIB machining apparatus 50. Based on the transferred data, the FIB machining apparatus 50 corrects the defect in the reticle pattern 60*a*. Namely, the pattern inspection of the reticle 60 and the pattern correction thereof based on the result of the pattern inspection are completed.

Figure 5:
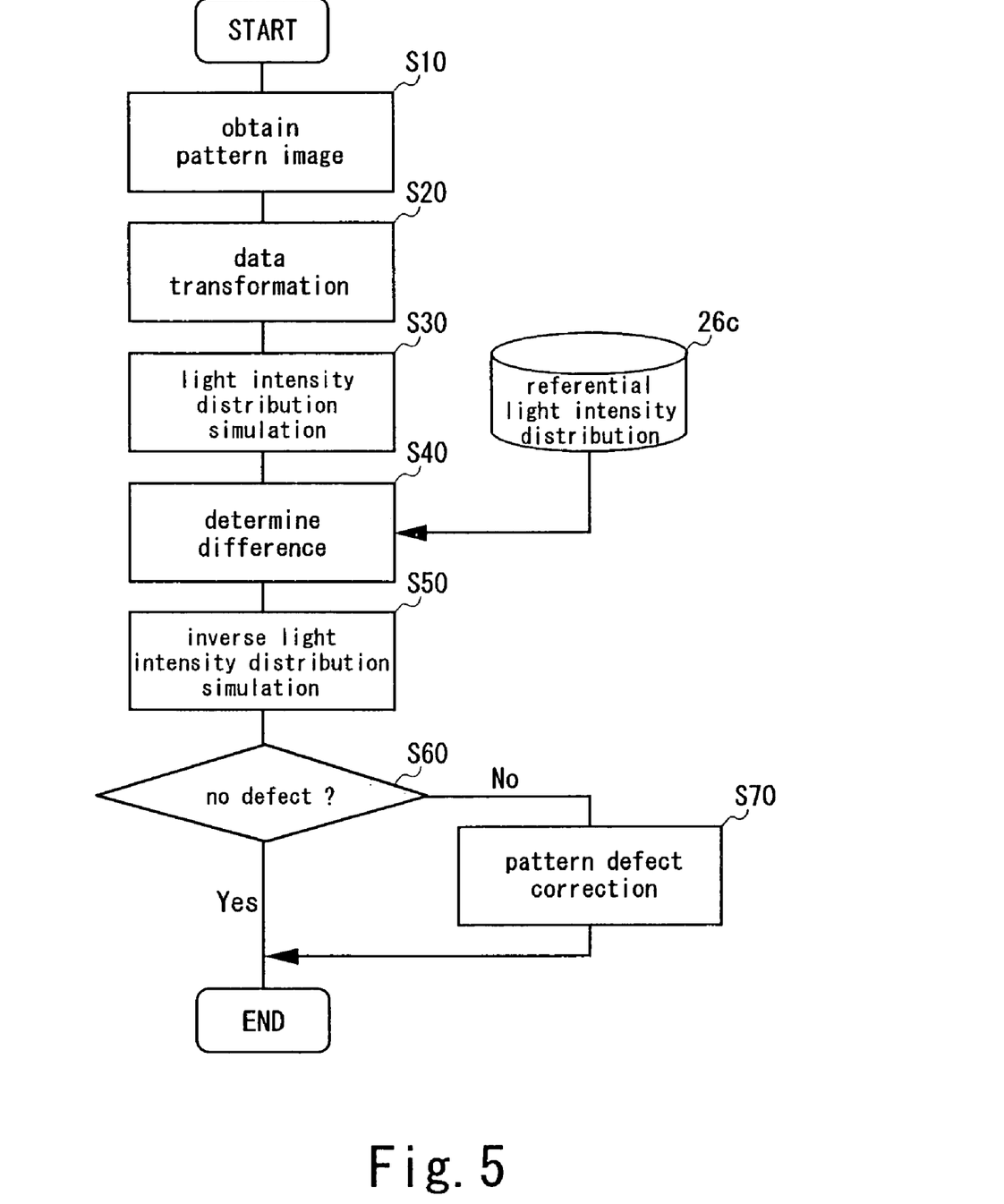
FIG. 5 is a flowchart showing pattern inspection processing according to the first embodiment.

FIG. 5 shows the operation of the pattern inspection processing according to the first embodiment.

The pattern inspection processing of the reticle 60 is performed by the CPU 26*b* of the workstation 20 executing the pattern inspection program stored in the hard disk 26*c*.

In a step S10, the image of the reticle pattern 60*a* as shown in FIG. 2(*a*) is acquired by the SEM 40. Thereafter, processing proceeds to a step S20.

In the step S20, the image of the reticle pattern 60*a* which is obtained in the step S10 is transformed into the reticle pattern data as shown in FIG. 2(*b*). Thereafter, processing proceeds to a step S30.

In the step S30, the light intensity distribution simulation is performed using the reticle pattern data which is obtained in the step S20, to thereby obtain the light intensity distribution of the reticle pattern 60*a* as shown in FIG. 2(*c*). Thereafter, processing proceeds to a step S40.

It should be noted that the light intensity distribution (FIG. 3(*b*)) which is obtained by performing the light intensity distribution simulation using the drawing pattern data as shown in FIG. 3(*a*) is stored in the hard disk 26*c* in advance as referential light intensity distribution.

In the step S40, the light intensity distribution which is obtained by the light intensity distribution simulation using the drawing pattern data is loaded from the hard disk 26*c*. Next, as shown in FIG. 4(*a*), the difference between the light intensity distribution of the reticle pattern 60*a* obtained in the step S30 and the light intensity distribution obtained by the light intensity distribution simulation using the drawing pattern data is determined. Thereafter, processing proceeds to a step S50.

In the step S50, the inverse light intensity distribution simulation is performed using the difference obtained in the step S40, to thereby obtain the difference pattern data shown in FIG. 4(*b*). Thereafter, processing proceeds to a step S60.

In the step S60, the defect in the reticle pattern 60*a* is automatically determined using the difference pattern data obtained in the step S50. When the reticle pattern 60a does not have the defect, the pattern inspection of the reticle 60 is completed. When the reticle pattern 60a has the defect, the data showing the shape, location and the like of the defect in the reticle pattern 60a is generated from the difference pattern data. Thereafter, processing proceeds to a step S70.

In the step S70, the data showing the shape, location and the like of the defect in the reticle pattern 60a is transferred to the FIB machining apparatus 50. Based on the transferred data, the FIB machining apparatus 50 corrects the defect in the reticle pattern 60a. Namely, the pattern inspection of the reticle 60 and the pattern correction thereof based on the result of the pattern inspection are completed.

The following effects can be obtained according to the above-described first embodiment.

The inverse light intensity distribution simulation is performed using the difference between the light intensity distribution of the reticle pattern 60a and the light intensity distribution obtained by the light intensity distribution simulation using the drawing pattern data, so that a differential between the patterns which are respectively formed by transferring the reticle pattern 60a and the pattern shown by the drawing pattern data can be recognized as the defect in the reticle pattern 60a. Further, since the difference pattern data corresponds to the image of the differential between the patterns which are respectively formed by transferring the reticle pattern 60a and the pattern shown by the drawing pattern data, the defect in the reticle pattern 60a can be recognized as the image. Therefore, the presence/absence of the defect in the reticle pattern 60a can be determined with high accuracy, and the defect location in the reticle pattern 60a can be identified easily and certainly. Therefore, pattern inspection time of the reticle 60 can be shortened. As a result of this, production cost of the reticle 60 can be reduced. In other words, manufacturing cost of a device manufactured using the reticle 60 can be reduced.

The drawing pattern data is already generated for the pattern formation of the reticle 60. Therefore, it is not necessary to newly generate the input data of the light intensity distribution simulation for obtaining the light intensity distribution to be compared with the light intensity distribution of the reticle pattern 60a.

The drawing pattern data is generated so that the pattern formed on a transfer target by transferring the reticle pattern 60a realizes desired device characteristics. Therefore, when the reticle pattern 60a is formed the same as the drawing pattern data, the device formed on the transfer target has the desired characteristics. As a result of this, the light intensity distribution obtained by the light intensity distribution simulation using the drawing pattern data is suitable for an object to be compared with the light intensity distribution of the reticle pattern 60a. Meanwhile, when the pattern to be formed on the transfer target is actually formed on the transfer target, the device formed on the transfer target has the desired characteristics. Therefore, the light intensity distribution of the pattern to be formed on the transfer target is the ideal light intensity distribution as the object to be compared with the light intensity distribution of the reticle pattern 60a. As a result of this, the presence/absence of the defect in the reticle pattern 60a can be determined with high accuracy, and the defect location in the reticle pattern 60a can be identified certainly. Therefore, whichever is selected as the light intensity distribution of the reticle pattern 60a, the presence/absence of the defect in the reticle pattern 60a can be determined with high accuracy, and the defect location in the reticle pattern 60a can be identified certainly.

Since the light intensity distribution which is obtained by the light intensity distribution simulation using the drawing pattern data is stored in the hard disk 26c in advance, it becomes unnecessary to perform the light intensity distribution simulation using the drawing pattern data when performing the pattern inspection. Meanwhile, since the light intensity distribution of the pattern to be formed on the transfer target is stored in the hard disk 26c in advance, it becomes unnecessary to perform the light intensity distribution simulation for obtaining the light intensity distribution to be compared with the light intensity distribution of the reticle pattern 60a. Therefore, the efficiency of the pattern inspection of the reticle 60 can be improved.

According to the Fourier transform and the inverse Fourier transform, one transforms the output of the other to thereby restore the input of the other. Therefore, by using the Fourier transform and the inverse Fourier transform for the light intensity distribution simulation and the inverse light intensity distribution simulation, respectively, the presence/absence of the defect in the reticle pattern 60a can be determined with high accuracy, and the defect location in the reticle pattern 60a can be identified easily and certainly.

By using the difference pattern data corresponding to the image of the differential between the patterns which are respectively formed by transferring the reticle pattern 60a and the pattern shown by the drawing pattern data, it is possible to obtain the result of the defect determination of the reticle pattern 60a without depending on the operator.

By providing the FIB machining apparatus 50, it is possible to automatically correct the defect in the reticle pattern 60a. Since no intervention of manpower is necessary, it is possible to correct the defect in the reticle pattern 60a in a short period of time.

Figure 6:
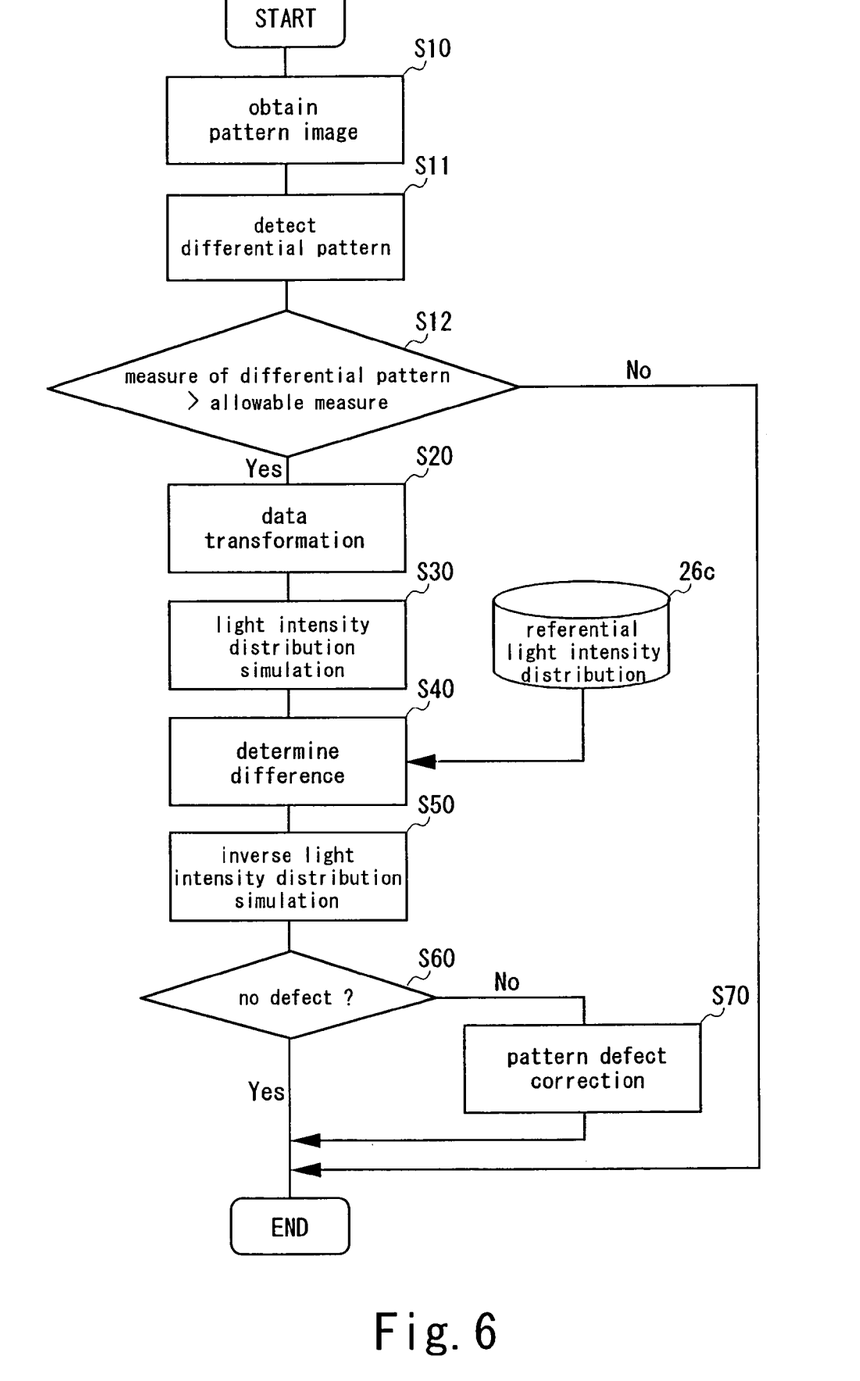
FIG. 6 is a flowchart showing a second embodiment of the present invention.

FIG. 6 shows the operation of pattern inspection processing according to a second embodiment of the present invention. A pattern inspection system of this embodiment is the same as that of the first embodiment (FIG. 1) except that a pattern inspection program recorded in a CD-ROM 30 or a flexible disk 32 is different. The same numerals and symbols are given to designate the same elements as those explained in the first embodiment, and detailed explanations thereof will be omitted.

The pattern inspection processing of a reticle 60 is performed by a CPU 26b of a workstation 20 executing the pattern inspection program stored in a hard disk 26c, similarly to the first embodiment.

First, a step S10 is executed similarly to the first embodiment. Thereafter, processing proceeds to a step S11.

In the step S11, the image of a reticle pattern 60a is compared with the image of a pattern shown by drawing pattern data (reference pattern), so that a differential pattern constituted of a mismatched part between the reticle pattern 60a and the pattern shown by the drawing pattern data is detected. Thereafter, processing proceeds to a step S12.

In the step S12, the measure of the differential pattern obtained in the step S11 is compared with allowable measure (reference measure). When the measure of the differential pattern does not exceed the allowable measure, the pattern inspection of the reticle 60 is completed. When the measure of the differential pattern exceeds the allowable measure, processing proceeds to a step S20. Then, processing in and after the step S20 are successively executed, similarly to the first embodiment.

The same effects as those of the first embodiment can be obtained in the above-described second embodiment as well. Further, since the differential pattern is detected only by directly comparing the image of the reticle pattern 60a with the image of the pattern shown by the drawing pattern data, defect determination of the reticle pattern 60a using the differential pattern (steps S11 and S12) can be performed in a short period of time. The processing of transformation from the image of the reticle pattern 60a into the reticle pattern data and afterward are performed only when the measure of the differential pattern exceeds the allowable measure, so that wasteful processes of the pattern inspection of the reticle 60 can be eliminated. Namely, the defect determination with low accuracy is first performed in the short period of time, and the defect determination with high accuracy is performed only when the reticle pattern 60a is determined to have the defect, so that the efficiency of the pattern inspection of the reticle 60 can be improved.

Figure 7:
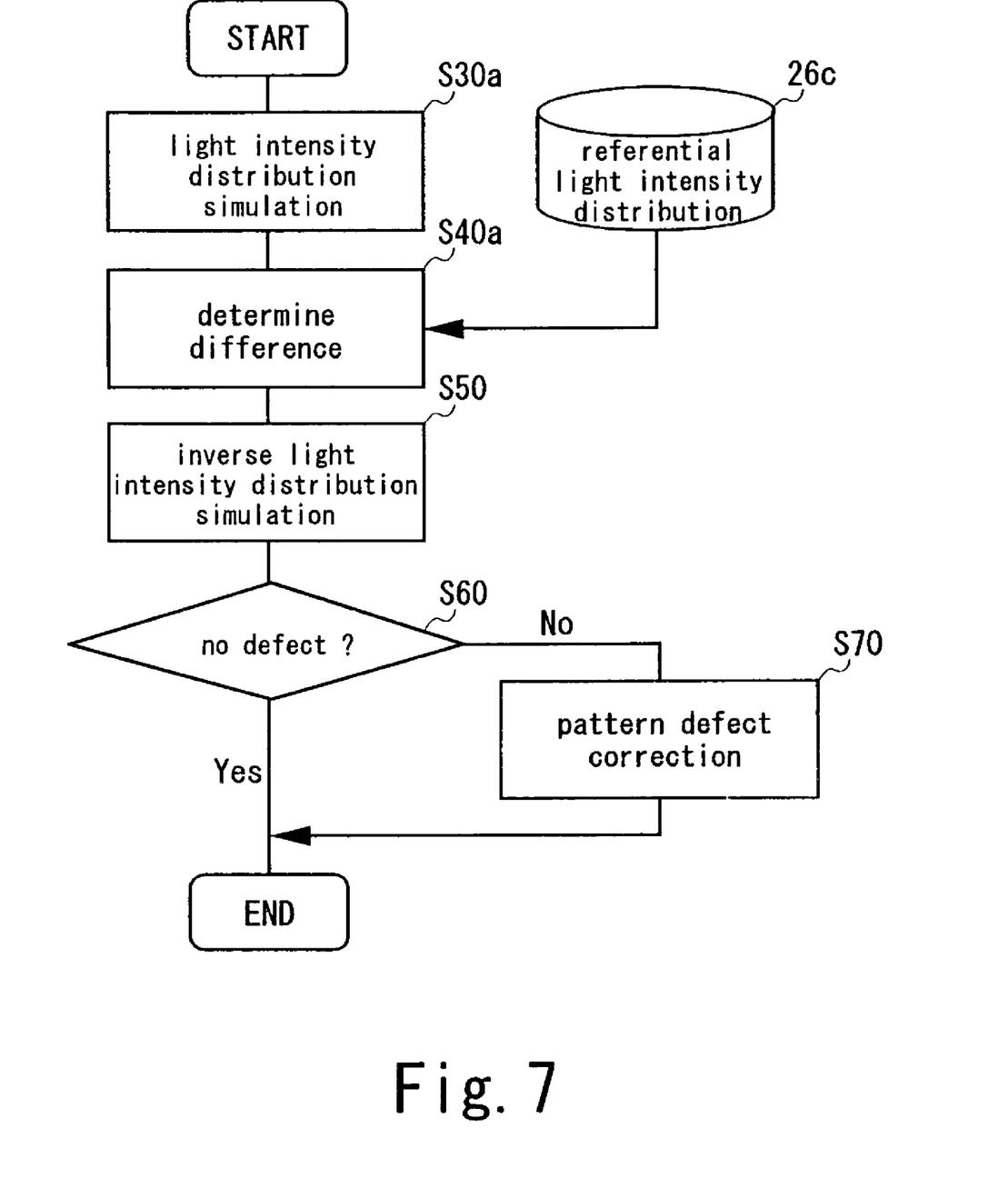
FIG. 7 is a flowchart showing a third embodiment of the present invention.

FIG. 7 shows the operation of pattern inspection processing according to a third embodiment of the present invention. A pattern inspection system of this embodiment is the same as that of the first embodiment (FIG. 1) except that a pattern inspection program recorded in a CD-ROM 30 or a flexible disk 32 is different. The same numerals and symbols are given to designate the same elements as those explained in the first embodiment, and detailed explanations thereof will be omitted.

The pattern inspection processing of a reticle 60 is performed by a CPU 26b of a workstation 20 executing the pattern inspection program stored in a hard disk 26c, similarly to the first embodiment.

In a step S30a, light intensity distribution simulation is performed using drawing pattern data, to thereby obtain light intensity distribution of a pattern shown by the drawing pattern data. Thereafter, processing proceeds to a step S40a.

Incidentally, light intensity distribution of a pattern to be formed on a wafer is stored in the hard disk 26c in advance as referential light intensity distribution.

In the step S40a, the light intensity distribution of the pattern to be formed on the wafer is loaded from the hard disk 26c. A difference between the light intensity distribution of the pattern shown by the drawing pattern data obtained in the step S30a and the light intensity distribution of the pattern to be formed on the wafer is determined. Thereafter, processing proceeds to a step S50. Then, processing in and after the step S50 are successively executed, similarly to the first embodiment.

In this pattern inspection processing, a defect in the pattern shown by the drawing pattern data is treated as a defect in a reticle pattern 60a, and therefore it is effective especially when the reticle pattern 60a is formed almost the same as the drawing pattern data.

The same effects as those of the first embodiment can be obtained in the above-described third embodiment as well. Further, since the defect in the pattern shown by the drawing pattern data is treated as the defect in the reticle pattern 60a, it becomes unnecessary to acquire the image of the reticle pattern 60a. Therefore, it is possible to improve the efficiency of the pattern inspection of the reticle 60.

Incidentally, in the first to third embodiments, the example of applying the present invention to the pattern inspection of the reticle 60 is explained. The present invention is not limited to such embodiments. For example, the present invention may be applied to pattern inspection of a photomask.

In the first to third embodiments, the example in which the defect in the reticle pattern 60a is automatically determined by the workstation 20 is explained. The present invention is not limited to such embodiments. For example, the defect in the reticle pattern 60a may be determined manually.

In the first and second embodiments, the example in which the correction unit of the pattern inspection system 10 is constituted of the FIB machining apparatus is explained. The present invention is not limited to such embodiments. For example, the correction unit of the pattern inspection system 10 may be constituted of a laser repair device.

The invention is not limited to the above embodiments and various modifications may be made without departing from the spirit and scope of the invention. Any improvement may be made in part or all of the components.

What is claimed is:

1. A pattern inspection method of a photomask comprising:
   acquiring an image of an inspection object pattern formed on the photomask;
   transforming the image of the inspection object pattern into inspection object pattern data as input data of light intensity distribution simulation for finding light intensity distribution in which optical conditions of an exposure system used in pattern transfer are reflected;
   performing the light intensity distribution simulation using the inspection object pattern data;
   finding a difference between light intensity distribution of the inspection object pattern obtained by the light intensity distribution simulation and reference light intensity distribution; and
   performing inverse light intensity distribution simulation having reversibility to the light intensity distribution simulation by using the difference, to obtain difference pattern data for determining a defect in the inspection object pattern.

2. The pattern inspection method of the photomask according to claim 1, wherein
   the reference light intensity distribution is light intensity distribution obtained by performing the light intensity distribution simulation using drawing pattern data used in pattern formation of the photomask.

3. The pattern inspection method of the photomask according to claim 1, wherein
   the reference light intensity distribution is light intensity distribution of a pattern to be formed on a transfer target by transferring the inspection object pattern.

4. The pattern inspection method of the photomask according to claim 1, wherein:
   the light intensity distribution simulation is performed using a Fourier transform;
   the inverse light intensity distribution simulation is performed using an inverse Fourier transform.

5. The pattern inspection method of the photomask according to claim 1, further comprising:
   detecting a differential pattern constituted of a mismatched part between the inspection object pattern and a reference pattern by comparing the image of the inspection object pattern and an image of the reference pattern, before said step of transforming the image of the inspection object pattern into the inspection object pattern data;
   comparing measure of the differential pattern with reference measure; and
   performing processing of the transformation from the image of the inspection object pattern into the inspection object pattern data and afterward only when the measure of the differential pattern exceeds the reference measure.

6. The pattern inspection method of the photomask according to claim 1, further comprising
   determining a defect in the inspection object pattern using the difference pattern data.

7. A pattern inspection method of a photomask comprising:
   performing light intensity distribution simulation for finding light intensity distribution in which optical conditions of an exposure system used in pattern transfer are reflected, using drawing pattern data used in pattern formation of the photomask;

finding a difference between the light intensity distribution obtained by the light intensity distribution simulation and light intensity distribution of a pattern to be formed on a transfer target by transferring an inspection object pattern formed on the photomask; and performing inverse light intensity distribution simulation having reversibility to the light intensity distribution simulation by using the difference, to obtain difference pattern data for determining a defect in the inspection object pattern.

8. A pattern inspection system of a photomask comprising:

an image acquisition unit acquiring an image of an inspection object pattern formed on the photomask; and a control unit inspecting the inspection object pattern, wherein said control unit transforms the image of the inspection object pattern obtained by said image acquisition unit into inspection object pattern data as input data of light intensity distribution simulation for finding light intensity distribution in which optical conditions of an exposure system used in pattern transfer are reflected, performs the light intensity distribution simulation using the inspection object pattern data, finds a difference between light intensity distribution of the the inspection object pattern obtained by the light intensity distribution simulation and reference light intensity distribution, and performs inverse light intensity distribution simulation having reversibility to the light intensity distribution simulation by using the difference, to obtain difference pattern data for determining a defect in the inspection object pattern.

9. The pattern inspection system of the photomask according to claim 8, wherein the reference light intensity distribution is light intensity distribution obtained by performing the light intensity distribution simulation using drawing pattern data used in pattern formation of the photomask.

10. The pattern inspection system of the photomask according to claim 8, wherein the reference light intensity distribution is light intensity distribution of a pattern to be formed on a transfer target by transferring the inspection object pattern.

11. The pattern inspection system of the photomask according to claim 8, wherein:

the light intensity distribution simulation is performed using a Fourier transform; and the inverse light intensity distribution simulation is performed using an inverse Fourier transform.

12. The pattern inspection system of the photomask according to claim 8, wherein said control unit detects a differential pattern constituted of a mismatched part between the inspection object pattern and a reference pattern by comparing the image of the inspection object pattern and an image of the reference pattern, before transforming the image of the inspection object pattern into the inspection object pattern data;

compares measure of the differential pattern with reference measure; and performs processing of the transformation from the image of the inspection object pattern into the inspection object pattern data and afterward only when the measure of the differential pattern exceeds the reference measure.

13. The pattern inspection system of the photomask according to claim 8, wherein said control unit determines a defect in the inspection object pattern using the difference pattern data.

14. The pattern inspection system of the photomask according to claim 13, further comprising a correction unit correcting the defect in the inspection object pattern based on the result of determination of the defect in the inspection object pattern.

15. A pattern inspection system of a photomask comprising a control unit inspecting an inspection object pattern formed on the photomask, wherein said control unit performs light intensity distribution simulation for finding light intensity distribution in which optical conditions of an exposure system used in pattern transfer are reflected, using drawing pattern data used in pattern formation of the photomask;

finds a difference between the light intensity distribution obtained by the light intensity distribution simulation and light intensity distribution of a pattern to be formed on a transfer target by transferring an inspection object pattern; and performs inverse light intensity distribution simulation having reversibility to the light intensity distribution simulation by using the difference, to obtain difference pattern data for determining a defect in the inspection object pattern.

16. A pattern inspection program of a photomask to be executed in a computer inspecting an inspection object pattern formed on the photomask, comprising:

transforming an image of the inspection object pattern into inspection object pattern data as input data of light intensity distribution simulation for finding light intensity distribution in which optical conditions of an exposure system used in pattern transfer are reflected;

performing the light intensity distribution simulation using the inspection object pattern data;

finding a difference between light intensity distribution of the inspection object pattern obtained by the light intensity distribution simulation and reference light intensity distribution; and performing inverse light intensity distribution simulation having reversibility to the light intensity distribution simulation by using the difference, to obtain difference pattern data for determining a defect in the inspection object pattern.

17. The pattern inspection program of the photomask according to claim 16, wherein said program causes a computer to execute performing the light intensity distribution simulation using drawing pattern data used in pattern formation of the photomask, to obtain said reference light intensity distribution.

18. The pattern inspection program of the photomask according to claim 16, wherein said program causes the computer to execute:

detecting a differential pattern constituted of a mismatched part between the inspection object pattern and a reference pattern by comparing the image of the inspection object pattern and an image of the reference pattern, before said step of transforming the image of the inspection object pattern into the inspection object pattern data;

comparing measure of the differential pattern with reference measure; and performing processing of the transformation from the image of the inspection object pattern into the inspection object pattern data and afterward only when the measure of the differential pattern exceeds the reference measure.

19. The pattern inspection program of the photomask according to claim 16, wherein said program causes the computer to execute determining a defect in the inspection object pattern using the difference pattern data.

20. A pattern inspection program of a photomask to be executed in a computer inspecting an inspection object pattern formed on the photomask, comprising:

performing light intensity distribution simulation for finding light intensity distribution in which optical conditions of an exposure system used in pattern transfer are reflected, using drawing pattern data used in pattern formation of the photomask;

finding a difference between the light intensity distribution obtained by the light intensity distribution simulation and light intensity distribution of a pattern to be formed on a transfer target by transferring an inspection object pattern formed on the photomask; and performing inverse light intensity distribution simulation having reversibility to the light intensity distribution simulation by using the difference, to obtain difference pattern data for determining a defect in the inspection object pattern.

* * * * *

UNITED STATES PATENT AND TRADEMARK OFFICE
CERTIFICATE OF CORRECTION

| | |
|---|---|
| PATENT NO. | : 7,466,405 B2 |
| APPLICATION NO. | : 11/093264 |
| DATED | : December 16, 2008 |
| INVENTOR(S) | : Satoshi Akutagawa et al. |

It is certified that error appears in the above-identified patent and that said Letters Patent is hereby corrected as shown below:

Column 12, Line 43, after "transform;" insert --and--.

Column 12, Line 52, after "said" delete "step of".

Column 13, Line 27, before "inspection" delete "the". (Second Occurrence)

Column 14, Line 60, after "said" delete "step of".

Signed and Sealed this

Eighth Day of December, 2009

David J. Kappos
*Director of the United States Patent and Trademark Office*